(12) United States Patent
Rao et al.

(10) Patent No.: US 11,276,462 B2
(45) Date of Patent: Mar. 15, 2022

(54) TECHNIQUES FOR A MULTI-STEP CURRENT PROFILE FOR A PHASE CHANGE MEMORY

(71) Applicant: Intel Corporation, Santa Clara, CA (US)

(72) Inventors: Hemant P. Rao, Albuquerque, NM (US); Shylesh Umapathy, Albuquerque, NM (US); Sanjay Rangan, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/903,004

(22) Filed: Jun. 16, 2020

(65) Prior Publication Data

US 2021/0391005 A1    Dec. 16, 2021

(51) Int. Cl.
*G11C 11/00* (2006.01)
*G11C 13/00* (2006.01)

(52) U.S. Cl.
CPC ........ *G11C 13/0004* (2013.01); *G11C 13/004* (2013.01); *G11C 13/0009* (2013.01); *G11C 13/0061* (2013.01); *G11C 13/0069* (2013.01)

(58) Field of Classification Search
CPC .............. G11C 13/0004; G11C 13/004; G11C 13/0069; G11C 13/0009; G11C 13/0061
See application file for complete search history.

(56) References Cited

U.S. PATENT DOCUMENTS

| | | | |
|---|---|---|---|
| 10,262,730 B1* | 4/2019 | Nardi | G11C 13/0004 |
| 2009/0310401 A1* | 12/2009 | Philipp | G11C 13/0004 365/163 |
| 2016/0284404 A1* | 9/2016 | Rangan | H01L 45/06 |
| 2017/0169886 A1 | 6/2017 | Rangan et al. | |

* cited by examiner

*Primary Examiner* — Uyen Smet
(74) *Attorney, Agent, or Firm* — Compass IP Law, PC

(57) ABSTRACT

Examples may include techniques to implement a SET write operation to a selected memory cell include in a memory array. Examples include selecting the memory cell that includes phase change material and applying various currents over various periods of time during a nucleation stage and a crystal growth stage to cause the memory cell to be in a SET logical state.

19 Claims, 10 Drawing Sheets

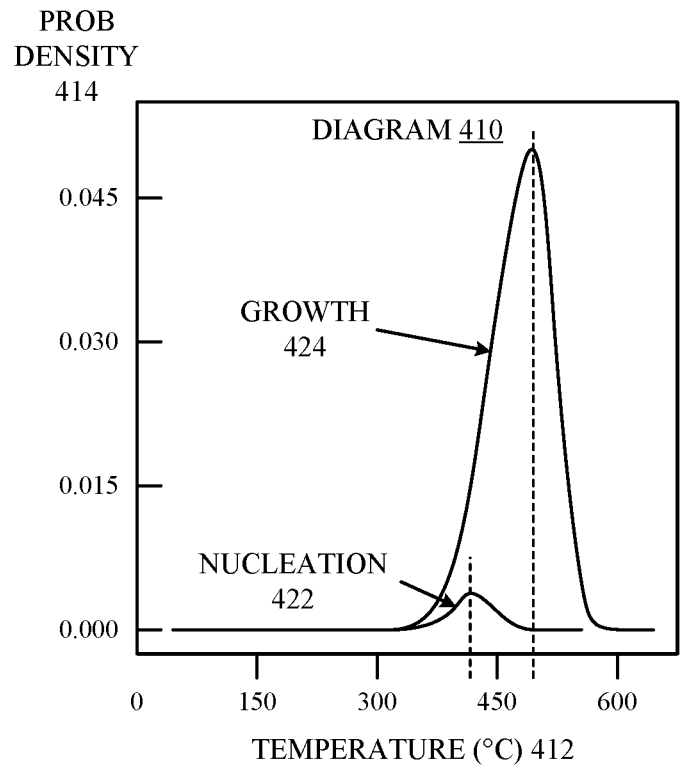
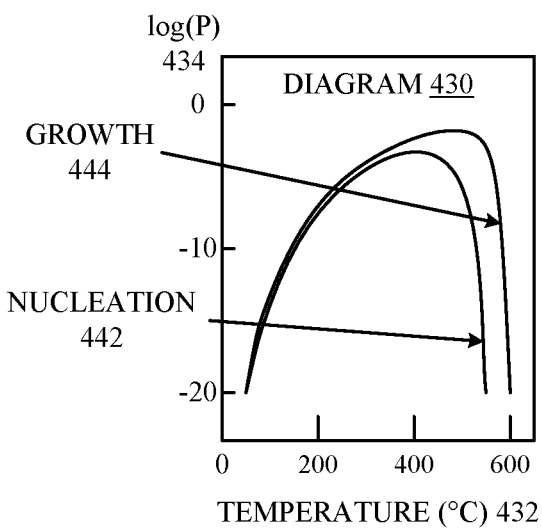
FIG. 4

800

SELECT A MEMORY CELL INCLUDED IN A MEMORY ARRAY TO IMPLEMENT A SET WRITE OPERATION, THE MEMORY CELL TO INCLUDE A PHASE CHANGE MATERIAL THAT CHANGES RESISTIVITY BASED ON BEING IN A CRYSTALLINE STATE OR A NON-CRYSTALLINE STATE, THE PHASE CHANGE MATERIAL HAVING A CONFINED STRUCTURE TO BECOME FULLY AMORPHIZED IN ALL ACTIVE AREAS IN A NON-CRYSTALLINE STATE, AND TO LACK SUFFICIENT CRYSTAL NUCLEI TO PROMOTE CRYSTAL GROWTH
802

CAUSE CURRENT TO BE APPLIED TO A TERMINAL OF THE MEMORY CELL TO CONTROL A CHANGE OF PHASE CHANGE MATERIAL INCLUDED IN THE MEMORY CELL FROM THE NON-CRYSTALLINE STATE TO THE CRYSTALLINE STATE, THE CHANGE FROM THE NON-CRYSTALLINE STATE TO THE CRYSTALLINE STATE TO INCLUDE A NUCLEATION STAGE TO CREATE CRYSTAL SEEDS, FOLLOWED BY A CRYSTAL GROWTH STAGE TO PROMOTE CRYSTAL GROWTH TO SET THE CRYSTALLINE STATE AND CAUSE THE MEMORY CELL TO BE IN A SET LOGICAL STATE, THE NUCLEATION STAGE TO INCLUDE APPLICATION OF A FIRST CURRENT OVER A FIRST TIME PERIOD FOLLOWED BY APPLICATION OF AT LEAST ONE SECOND CURRENT OVER A SECOND TIME PERIOD, THE CRYSTAL GROWTH STAGE TO INCLUDE APPLICATION OF AT LEAST ONE THIRD CURRENT AND A FOURTH CURRENT OVER RESPECTIVE THIRD AND FOURTH TIME PERIODS
804

*FIG. 8*

Storage Medium 900

Computer Executable Instructions for 800

FIG. 9

TECHNIQUES FOR A MULTI-STEP CURRENT PROFILE FOR A PHASE CHANGE MEMORY

TECHNICAL FIELD

Examples described herein are generally related to techniques for a multi-step current profile for a phase change memory implemented as part of a SET algorithm.

BACKGROUND

Memory resources have innumerable applications in electronic devices and other computing environments. A continuous drive to create smaller and more energy efficient memory devices to provide memory resources has resulted in scaling issues in relation to traditional types of memory devices that are based on using electron charges for data storage and access. Phase change materials (PCMs) are based on a property of certain compounds to take on one of two or more states based on heat applied to the material(s) included in PCMs. In some examples, PCMs include chalcogenide materials, which may exhibit at least two states: a structured crystalline state and a non-ordered amorphous state. These two states typically depend on characteristics of the application of heat to the chalcogenide materials. PCMs offer potential advantages for use in memory in that they are non-volatile and can potentially scale to relatively small memory cells due to the storage and access of data being based on a structure/state of the material instead of maintaining an electron charge.

BRIEF DESCRIPTION OF THE DRAWINGS

FIG. 4 illustrates example representations.
FIG. 8 illustrates an example of a logic flow.
FIG. 9 illustrates an example of a storage medium.

DETAILED DESCRIPTION

Figure 1:
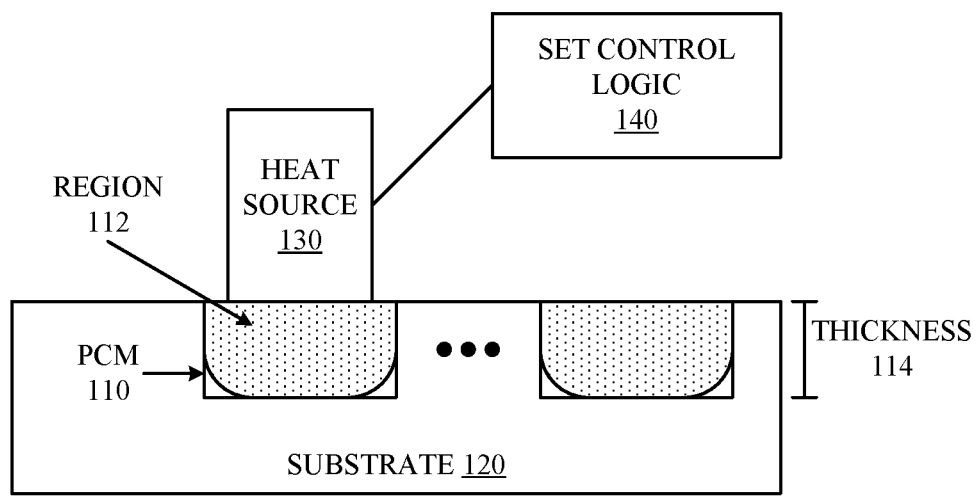
FIG. 1 illustrates an example first system.

Access performance in memories based on memory cell structures that include PCMs have historically been worse than that of established memory technologies having memory cell structures arranged to maintain an electron charge. Recently, read latency has improved to be comparable to these other, established memory technologies, but write latency continues to be not as comparable. Write latency in PCMs is primarily most limited by a SET algorithm that includes a first current pulse to crystallize or SET a PCM included in a memory cell from a RESET or amorphous state. Some SET algorithms may use a fixed ramp rate for either a ramp down approach (first heat the material to the amorphous state, and control the cooling to attempt to change to the crystalline state), or a ramp up approach (controlled increase in temperature to attempt to promote crystallization). These approaches for a SET algorithms attempt to ensure that memory cells experience an optimal SET temperature to minimize SET latency/duration, which in turn typically reduces write latency.

In some examples, both ramp up and ramp down approaches for a SET algorithm perform reasonably well in memory cells including unconfined PCM but are not effective in cells including fully amorphized PCM. For these examples, an unconfined PCM refers to a PCM that is not fully amorphized in a RESET state, and thus may include crystal nuclei or a crystalline region. Thus, ramp up/down SET algorithm approaches may include only a crystal growth stage to transform amorphous region(s) to a crystalline state based on the crystal nuclei already present. However, to scale PCM-based memories that have reduced cost and power consumption, a smaller memory cell size is needed. Observing that the extent to which the cell becomes fully amorphized correlates with PCM thickness and/or area of a memory cell, scaling PCM-based memories to smaller geometries results in memory cells that may not be SET efficiently by ramp up/down SET algorithms. Thus, ramp up/down SET algorithms may require confined memory cells to grow crystal, and scaling to smaller geometries reduces the number of crystal nuclei or the amount of crystalline area within PCM included in these smaller memory cells, which increases SET latency/duration. The PCM included in these smaller memory cells likely will not properly transition to the crystalline state when there are insufficient crystal nuclei or a sufficient crystalline region to promote subsequent crystal growth. Thus, ramp up/down SET algorithms may result in an unacceptably long SET latency/duration, negatively impacting write latency, and/or resulting in memory cells that are not SET effectively. Lack of an effective SET state may result in a higher bit error rate (BER) for data maintained at or accessed from these smaller memory cells.

According to some new approaches for a SET algorithm, a memory cell including PCM may be SET using a multi-stage SET algorithm. For these newer approaches, logic of a memory device (e.g., at a controller) may cause PCM included in memory cells to be heated to a first temperature for a first period of time. The first temperature may be arranged to promote nucleation of a crystalline state of the PCM. The logic may cause an increase of PCM temperatures to a second temperature for a second period of time. The second temperature may be arranged to promote crystal growth within the PCM. Nucleation and growth of the crystal cause the PCM to be SET in a crystalline state. As a result, this example multi-stage SET algorithm includes a two-step ramp up of temperatures to cause separate nucleation and growth stages. These types of two-step, multi-stage SET algorithms may work well when time allocated for low temperatures is relatively long. However, these new approaches may limit latency reduction as smaller and smaller memory cells containing lowering amount of PCM that require longer times at the nucleation stage to provide adequate amounts of crystal nuclei to result in an effective SET state following a growth stage.

In some examples, if the nucleation stage is not long enough to provide adequate amounts of crystal formation of small crystal nuclei, a second, higher temperature for the growth stage may result in PCM temperature that is too high during the growth stage. Thus, a combination of not long enough time for a nucleation state followed by a higher temperature during the growth stage may result in unstable, small crystal nuclei. The unstable, small crystal nuclei may result in memory cells that include PCM not being SET effectively. Lack of an effective SET state may result in a higher bit error rate (BER) for data maintained at or accessed from these smaller memory cells when using two-step, multi-stage SET algorithms.

According to some examples, as described in more detail below, an improved SET algorithm may include a multi-step current profile for a crystallization SET process having two different stages: a nucleation stage to generate crystalline nuclei; and, a crystal growth stage to promote crystal growth from those nuclei generated during the nucleation stage. Typically, a rate of nucleation, which is a stochastic process and occurs at a much slower rate, has a peak at lower temperatures relative to temperatures for crystal growth, which is typically at an orders of magnitude higher rate for peak crystal growth at a higher temperature. As used herein, a SET algorithm including a multi-step current profile may refer to an algorithm or procedure in which different, discrete temperature levels or temperature ramps are applied (e.g., through a controlled application of current and/or light) for a period of time before changing a temperature level. Thus, in one example, each time the temperature level rises above a threshold level may be considered a different step of the SET algorithm. Multi-step application of temperature or heat to PCM included in a memory cell may provide an isothermal condition to allow the different material state changes to occur (nucleation and/or crystal growth).

In some example, logic for a memory device having memory cells that include PCM may cause application of different temperature levels through joule heating by causing varying amounts of current to be applied to the PCM to heat the PCM according to a multi-step current profile. It will be understood that the specific values of current used for joule heating may vary by type of material used for PCM and/or vary based on relative location of the memory cell within a memory array of the memory device. As described herein, an improved SET algorithm includes a nucleation stage at a lower temperature level to generate crystal nuclei, followed by multiple steps at higher temperature levels to complete the crystal growth. In terms of joule heating via application of a current, the improved SET algorithm may be executed via a lower amplitude current pulse to initiate the crystallization process through crystal nuclei generation, followed by a rising amplitude current pulses to complete the crystallization process and accelerate the crystal growth.

Reference to memory devices can apply to different memory types. Memory devices generally refer to volatile memory technologies. Volatile memory is memory whose state (and therefore the data stored on it) is indeterminate if power is interrupted to the device. Non-volatile memory refers to memory whose state is determinate even if power is interrupted to the device. Dynamic volatile memory requires refreshing the data stored in the device to maintain state. One example of dynamic volatile memory includes dynamic random access memory (DRAM), or some variant such as synchronous DRAM (SDRAM). A memory subsystem as described herein may be compatible with various memory technologies. The various memory technologies may include, but are not limited to, DDR3 (double data rate version 3, JESD79-3, originally published by JEDEC (Joint Electronic Device Engineering Council) on Jun. 27, 2007), DDR4 (DDR version 4, JESD79-4, originally published in September 2012 by JEDEC), LPDDR3 (low power DDR version 3, JESD209-3B, originally published in August 2013 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235, originally published by JEDEC in October 2013), LPDDR5 (originally published by JEDEC in February 2019), HBM2 ((HBM version 2), originally published by JEDEC in December 2018), DDR5 (DDR version 5, currently in discussion by JEDEC), or others or combinations of memory technologies, and technologies based on derivatives or extensions of such specifications.

In addition to, or alternatively to, volatile memory, in some examples, reference to memory devices may refer to a non-volatile memory device whose state is determinate even if power is interrupted. The non-volatile memory device may include non-volatile memory. Nonlimiting examples of nonvolatile memory may include any or a combination of: planar or 3D NAND flash memory or NOR flash memory, 3D cross-point memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), resistive RAM, other various types of non-volatile random access memories (RAMs), and/or magnetic storage memory.

FIG. 1 illustrates an example system 100. In some examples, as shown in FIG. 1, system 100 includes System 100 includes substrate 120 in which PCM 110 is disposed. In some examples, substrate 120 may be a semiconductor substrate in which a semiconductor PCM is processed as a memory cell. For these examples, substrate 120 may be a plastic or other material on which a chalcogenide glass or other PCM is disposed as a storage medium. PCM 110, as shown in FIG. 1, may have a thickness 114. Thickness 114 may allow a memory cell size to be scaled down for denser bit arrays or memory cell arrays.

According to some examples, due to thickness 114, PCM 110 may be a fully amorphized material in a RESET logical state. Reference to a "fully" amorphized material does not necessarily mean that every bit of PCM deposited or otherwise processed on substrate 120 is amorphous in a RESET logical state. Rather, fully amorphized material may refer to all active area in the PCM being amorphized, as illustrated by region 112 of FIG. 1. Region 112 may or may not completely include all phase change material in PCM 110 (as illustrated by the shaded/patterned region not coming all the way out to the corners). Rather, region 112 may be fully amorphized in that it does not include sufficient nuclei to promote crystal growth without first seeding the crystal growth. System 100 and other figures herein are not necessarily drawn to scale. An amount of crystal nuclei that is needed to promote growth may be different for different PCMs. Generally, crystal growth occurs much faster than nucleation, and at a significantly higher temperature. The crystalline or SET logical state of PCM 110 may be highly ordered and has a relatively low resistance and relatively high reflectivity compared to an amorphous or RESET logical state of PCM 110. The logical state of PCM 110 may thus be read via either determining the resistance of the PCM or via refractivity of light. Thus, PCM 110 can be, for example, a PRAM or PCM or optical spinning disk, or other memory.

In some examples, heat source 130 may represent a source of heat for PCM 110. PCM 110 may be integrated onto an integrated circuit (I/C). Heat source 130 may include a terminal or resistive element adjacent a memory cell or other component of the I/C that may create heat when current is applied to the terminal or resistive element. In some examples, heat source 130 may be a light source (e.g., a laser) that creates heat optically. In some respects, in certain circuit applications, a resistive element adjacent to a memory cell could be an optical circuit seeing that it produces more light and more heat as more current is conducted through the resistive element. Thus, in some examples, heat source 130 may be integrated adjacent to PCM 110 and is also local to PCM 110. In other examples, heat source 130 may be remote from PCM 110, and includes a laser or other electromagnetic wave source to transmit with varying intensity on PCM 110 to cause heating of PCM 110.

According to some examples, set control logic 140 may represent circuitry arranged to control the operation of heat source 130. Set control logic 140 may be integrated on a common I/C with PCM 110. For example, set control logic 140 may be integrated on a common substrate 120 with PCM 110. Set control logic 140 may control heat source 130 to cause heat to be applied to PCM 110 in different stages to first promote nucleation, and then to promote crystal growth from the crystal nuclei generated. In some examples, set control logic 140 may separate the nucleation and/or the growth stages into multiple steps as part of implementing a SET algorithm to place PCM 110 in a SET logical state.

Figure 2:
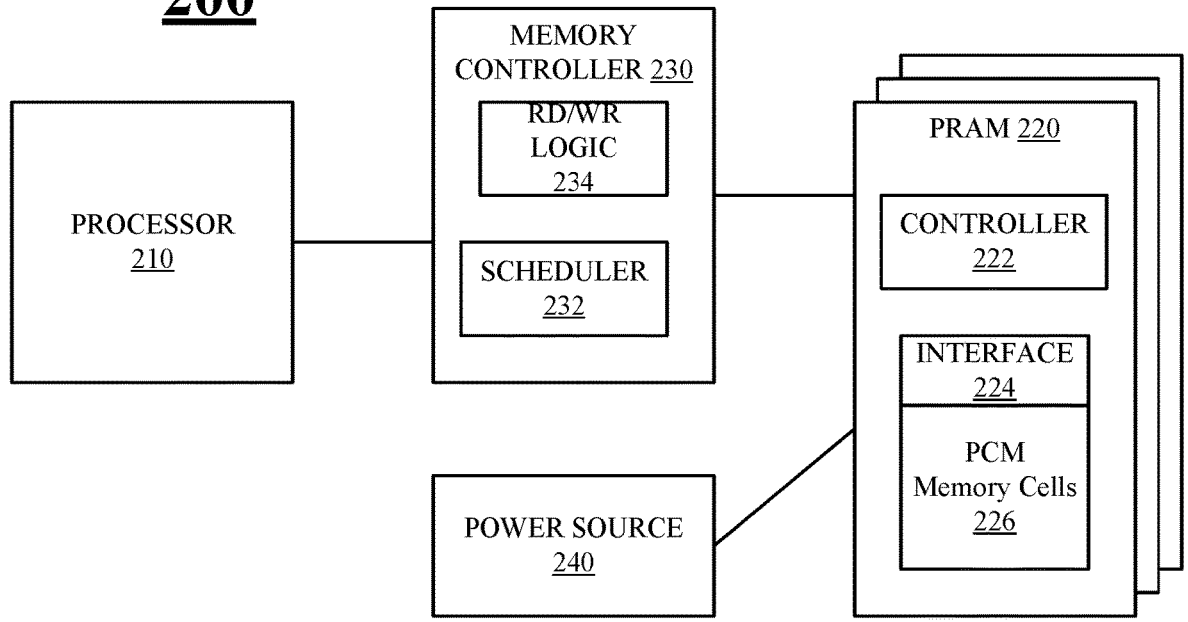
FIG. 2 illustrates an example second system.

FIG. 2 illustrates an example system 200. System 200 shown in FI. 2 may represent a block diagram of a system that applies a multi-stage phase change set procedure with a current based heat source. System 200 may be one example of system 100 of FIG. 1. In some examples, system 200 may represent components of a memory subsystem having a phase change random access memory (PRAM) 220 to store and provide data in response to operations of processor 210. For these examples, system 200 may receive memory access requests from a host or a processor 210, which is processing logic that executes operations based on data stored in PRAM 220 or generates data to store in PRAM 220. Processor 210 may be or may include host processor, central processing unit (CPU), microcontroller or microprocessor, graphics processor, peripheral processor, application specific processor, or other processor, whether as a single core processor or as a multicore processor.

According to some examples, as shown in FIG. 2, system 200 includes a memory controller 230, which represents logic to interface with PRAM 220 and manage access to data stored in the memory. In some examples, memory controller 230 may be integrated into processor 210. In other examples, memory controller 230 may be standalone hardware, separate from processor 210. In other examples, memory controller 230 may be a separate circuit on a substrate that includes processor 210. In other examples, memory controller 230 may be a separate die or chip integrated on a common substrate with another die that includes processor 210 (e.g., as part of a system on a chip (SoC)). In some examples, at least some of PRAM 220 may be included on an SoC with memory controller 230 and/or processor 210.

In some examples, memory controller 230 may include a read/write logic 234, which includes hardware to interface with PRAM 220. Read/write logic 234 may enable memory controller 230 to generate read and write commands to service requests for data access generated by the execution of instructions by processor 210. In some examples, as shown in FIG. 2, memory controller 230 includes a scheduler 232 to schedule the sending of access commands to PRAM 220 based on known timing parameters for read and write access to PRAM 220. Known timing parameters, for example, may be those that are preprogrammed or otherwise preconfigured into system 200. Such parameters may be stored in PRAM 220 and accessed by memory controller 230. At least some parameters may be determined by synchronization procedures. The timing parameters may also include timing associated with write latency for PRAM 220. Write latency for PRAM 220 may be determined by an ability of PRAM 220 to change a logical state of bits maintained in PCM memory cells included in a memory array. For example, change the PCM included in these memory cells from an amorphous RESET logical state (e.g., bit=0) to a crystalline SET logical state (e.g., bit=1) in accordance with any embodiment described herein.

According to some examples, memory resources or memory array or cache lines included in PRAM 220 may be represented by PCM memory cells 226, For these examples, PCM memory cells 226 include PCM, where the PCM for a given memory cell of PCM memory cells 226 is fully amorphized in a RESET logical state. PRAM 220 includes an interface logic 224 to control the access to PCM memory cells 226. Interface logic 224 may include decode logic to address specific rows or columns or bits of data maintained in PCM memory cells 226. In some examples, interface logic 224 may control an amount of current provided to specific memory cells of PCM memory cells 226. Thus, control over writing to PCM memory cells 226 may occur through driver and/or other access circuitry included in or coupled with interface logic 224.

In some examples, controller 222 of PRAM 220 may be an on-die controller to control internal operations of PRAM 220 in order for PRAM 220 to execute commands received from memory controller 230. For example, controller 222 may control timing, addressing, I/O (input/output) margining, scheduling, or error correction for PRAM 220.

According to some examples, controller 222 may be configured to write data to PCM memory cells 226 in accordance with any example described herein with separate nucleation and growth phases. For these examples, controller 222 may control operations of interface 224 to provide or cause current to pass through memory cells of PCM memory cells 226 selected to have data written. For example, causing the heating up of the selected memory cells in stages to write the data to the selected memory cells.

In some examples, system 200, as shown in FIG. 2, includes a power source 240. Power source 240 may be a voltage source or regulator that provides power to PRAM 220. Controller 222 and/or interface logic 224 may use power available from power source 240 to cause selected memory cells of PCM memory cells 226 to be heated up to write data. The heating of the selected memory cells to include putting selected memory cells in a crystalline state (SET logical state) in accordance with any example described herein. Controller 222 and interface logic 224 may be considered control circuitry that heats PCM memory cells 226 to a first temperature for a first period of time controlled by controller 222. The first temperature and the first period of time established to promote nucleation of a crystalline state of the PCM memory cells 226. Controller 222 may then cause interface logic 224 to conduct more current and consequently increase the temperature of PCM memory cells 226 from the first temperature to subsequently higher temperatures for multiple steps having respective periods of time. The subsequently higher temperatures and the multiple steps having respective periods of time to promote crystal growth for PCM included in selected memory cells of PCM memory cells 226 to set the PCM to a crystalline state. Controller 222 and interface logic 224 may cause the current to pass through selected memory cells of PCM memory cells 226 to heat up the PCM included in the selected memory cells, in addition to possibly passing the current through other interface hardware.

Figure 3:
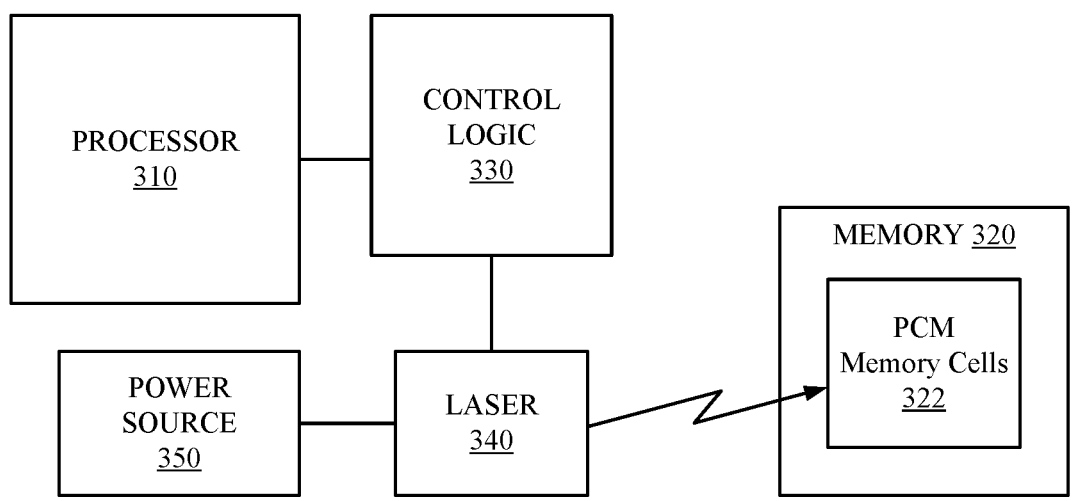
FIG. 3 illustrate an example third system.

FIG. 3 illustrates an example system 300. In some examples, system 300 may represent a block diagram of a system that applies a multi-step current profile for a phase change memory SET process utilizing a light based heat source. System 300 may be one example of system 100 described above and shown in FIG. 1. In some examples, system 300, shown in FIG. 3, includes a memory 320 that has PCM memory cells 322 to store and provide stored data responsive to operations of processor 310. Processor 310 may be any processor such as that described above for processor 210 of system 200. Processor 310 may execute operations based on data stored in memory 320 or generate data to store in memory 320.

According to some examples, as shown in FIG. 3, system 300 also includes a control logic 330 to control writes to memory 320. In some examples, control logic 330 is or is part of a memory controller. In some examples, control logic 330 may be integrated with processor 310, or on a same substrate as processor 310, or as part of an SoC with processor 310. In some examples, control logic 330 may control access to memory 320 via laser 340, for example, when memory 320 is written optically.

According to some examples, as shown in FIG. 3, system 300 includes a laser 340. For these examples, laser 340 may be capable of optically heating selected memory cells of PCM memory cells 322. Power from a power source 350 may be used to control an intensity (energy per unit area) of light produced by Laser 340. For example, based on controlling the intensity of laser 340, control logic 330 may write to selected memory cells of PCM memory cells 332 in accordance with any example described herein with separate nucleation and growth phases. Thus, control logic 330 may control laser 340 to irradiate selected memory cells of PCM memory cells 322 to write data to memory 320, including putting PCM included in selected memory cells in a crystalline state in accordance with any example described herein.

In some examples, control logic 330 and laser 340 may be considered a control circuit that heats selected memory cells of PCM memory cells 322 to a first temperature for a first period of time controlled by control logic 330. The first temperature and the first period of time promote nucleation of a crystalline state of the PCM included in the selected memory cells of PCM memory cells 322. Control logic 330 may then cause laser 340 to increase the intensity of light via a multi-step process to increase the temperature of the selected memory cells from the first temperature to subsequently higher temperatures for multiple steps having respective periods of time. The second temperature and the second period of time may promote crystal growth within PCM memory cells 322 to set the PCM to the crystalline state. The subsequently higher temperatures and the multiple steps having respective periods of time to promote crystal growth for PCM included in selected memory cells of PCM memory cells 322 to set the PCM to a crystalline state.

FIG. 4 illustrates example representations 400. In some examples, as shown in FIG. 4, representations 400 includes a diagram 410 and a diagram 430. For these examples, diagrams 410 and 430 provide a basis for separating the heating of PCM into multiple steps to transition PCM included in selected memory cells to a crystalline state. For example, diagram 410 illustrates probability density 414 plotted against temperature 412. Diagram 410 includes two curves: curve 422 illustrating the probability density of nucleation as temperature changes, and curve 424 illustrating the probability density of crystal growth as temperature changes.

As mentioned previously, some traditional approaches to heat PCM included in memory cells to cause a transition of the PCM to a crystalline state as part of a SET algorithm assumes that crystal nuclei already exist in the PCM. Thus, SET algorithms initially focus on growth of the crystal, and ramping temperature via multiple steps tries to apply an increasing temperature range to shorten a time needed to reach an acceptable amount of crystal growth (e.g., maximum crystal grown). As shown in diagram 410, it may be observed that a maximum efficiency for nucleation may be achieved somewhere in the range of 400° C. for a particular PCM that was tested to generate diagram 410, whereas a maximum efficiency for growth occurs somewhere closer to the range of 500° C. for the particular PCM. It will also be observed that there is overlap within the range of 400-500° C., which allows nucleation and growth to both occur, but will occur at much lower efficiency, which extends the time needed to set the crystalline state. It will be understood that different PCMs may have different temperatures and temperature ranges. For example, another PCM tested may be expected to achieve nucleation somewhere in the range of 250° C., with maximum growth occurring somewhere above 300° C. Thus, the example is merely one illustration, and is not limiting. Other materials for PCMs with other temperature ranges can also be used in accordance with any example of a multi-step SET process or procedure described herein.

According to some examples, as shown in FIG. 4, diagram 430 illustrates similar information compared to diagram 410, but on a logarithmic scale. Thus, in one embodiment, diagram 430 illustrates log(P) 434, which is the log of probability density 414, against temperature 432. Curve 442 illustrates nucleation occurring most efficiently around the range of 400° C., and curve 444 illustrates growth occurring most efficiently around the range of 500° C. Thus, it will be understood that performing a set to the crystalline state will benefit with improved efficiency by separating the nucleation and growth phases as part of a multi-step SET process.

Figure 5:
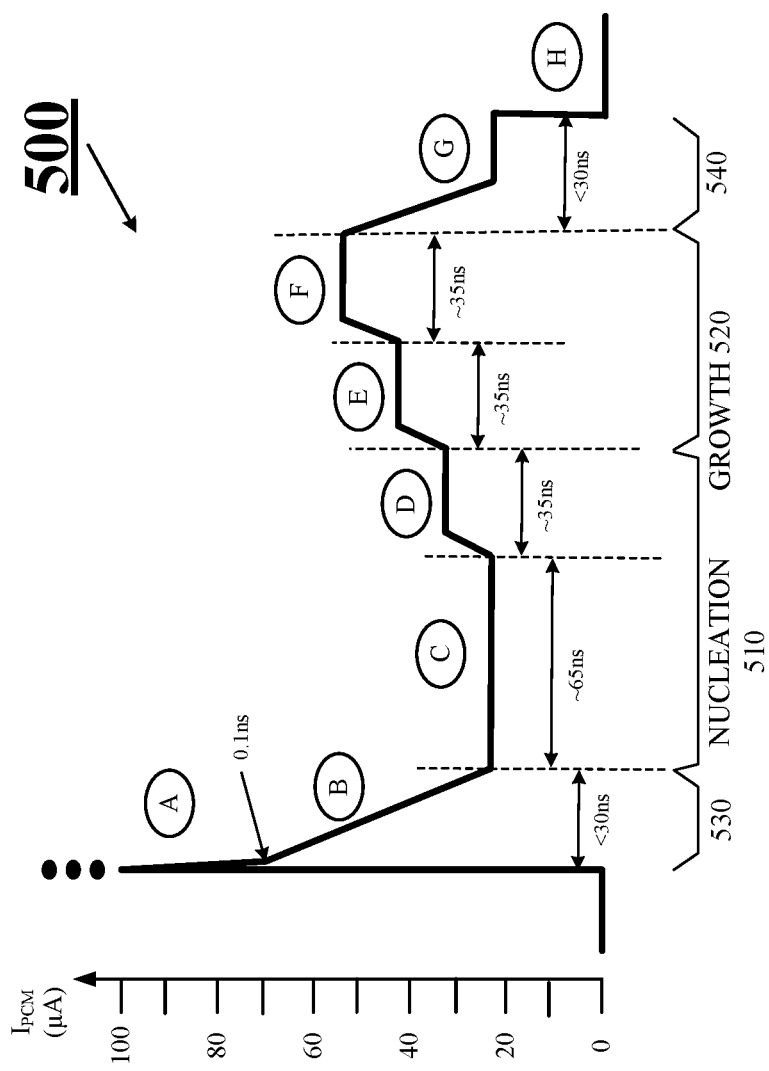
FIG. 5 illustrates an example first current profile.

FIG. 5 illustrates an example current profile 500. In some examples, current profile 500 may be a diagrammatic representation of an example of a multi-step current profile for a crystal growth stage for a crystallization SET process having two different stages shown in FIG. 5 as nucleation 510 and growth 520. For these examples, nucleation 510 may represent a nucleation stage to generate crystalline nuclei and growth 520 may represent a crystal growth stage to promote crystal growth from those nuclei generated during nucleation 510. Current profile 500 may be a diagram of an example multi-step current profile for an algorithm or procedure in which different, discrete temperature levels are applied for a period of time before changing or stepping up to a higher temperature level while progressing through nucleation 510 and growth 520 stages. Current profile 500 may illustrate a current profile established or tested to complete a crystallization SET process on a specific PCM structure of a memory architecture or configuration. It will be understood that different memory architectures and/or different PCM structure may have established variations compared to the values illustrated, although the base idea of a multi-step current profile as shown in FIG. 5 for current profile 500 is expected to apply the same.

According to some examples, the multiple steps of current profile 500 may be seen in contrast to historical SET algorithms, which either provide a pulse that melts the crystal and then quenches it to allow the crystal to grow, or that continuously ramps up the current and temperature in a single step to achieve crystallization, or that have a relatively long nucleation stage compared to a growth stage (e.g., 8-10 times longer). Current profile 500 may be understood as having four different stages, initialization 530, nucleation 510, growth 520, and finalization 540.

In some examples, current profile 500 starts with an initial pulse of current at A, which can initially melt PCM included in a selected memory cell. The current spike at A may be minimized to the least amount of current needed to amorphize the PCM, which allows the PCM to cool back to a lower temperature sooner to start the nucleation stage. For example, the current pulse at A is limited to below 150 microamps (μA) for approximately 0.1 nanosecond (ns), where the current may dissipate and result in the PCM cooling at B. For this example, it is anticipated that the time from the initial pulse to the start of nucleation (i.e., the time for initialization 530) will be less than 30 ns.

According to some examples, as shown in FIG. 5, nucleation 510 begins at C, which includes application of a current of approximately 20-30 μA. Application of the 20-30 μA may occur for approximately 65 ns. For these examples, the 20-30 μA may raise a temperature of PCM included in selected memory cells to a lowest temperature to facilitate generation of crystal nuclei in the PCM. Nucleation 510 then continues at D, which includes a first step increase in current to approximately 30-40 μA for approximately 35 ns. The first step increase at D may raise the temperature of the PCM to capture remaining bits in nucleation distribution and begin to facilitate crystal growth. Growth 520 then begins at E, which includes a second step increase in current to approximately 40-50 μA for approximately 35 ns to cause the PCM to reach a mid-temperature to enhance crystal growth for low growth current bits. Growth 520 then continues to F, which includes a third step increase in current to approximately 50-70 μA for approximately 35 ns. The third step increase at E to be the highest temperature for the PCM to enable further enhanced crystal growth and to cause the PCM to be in a SET logical state.

In some examples, as shown in FIG. 5, current profile 500 at G includes a ramp down of current during finalization stage 540 to reach I. For these examples, the current may be ramped down to and maintained at approximately 20-30 μA in about 30 ns or less. Finalization stage 540 may include a controlled ramp down or step down with a hold at a SET-back current. It may be understood that it is possible for certain areas of PCM included in a selected memory cell may become disturbed over the course of growth 520 and melt back to an amorphous state. Finalization stage 540 may provide a short period of lower temperature control to allow the PCM to anneal and "heal up" disturbances in the grown crystal that might occur from some overheating in portions of the crystalline structure of the PCM.

Figure 6:
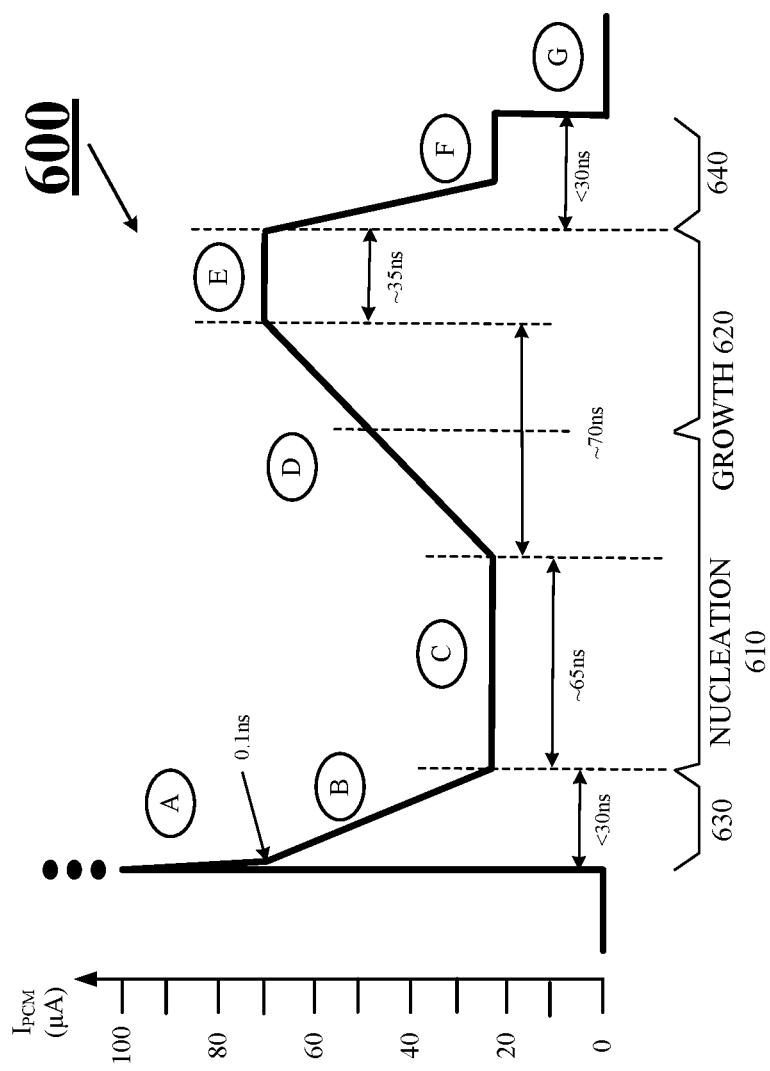
FIG. 6 illustrates an example second current profile.

FIG. 6 illustrates an example current profile 600. In some examples, current profile 600 may be diagrammatic representation similar to current profile 500 shown in FIG. 5. For example, current profile 600 may also be multi-step current profile for a crystal growth stage for a crystallization SET process having two different stages shown in FIG. 6 as nucleation 610 and growth 620. Current profile 600 shown in FIG. 6 is different than current profile 500 in that rather than holding a temperature steady for a period of time to move a PCM from a nucleation stage to a growth stage, a relatively slow ramp of current may be applied to a selected memory cell to allow for a relatively slow sweep from a low temperature to a high temperature. Also, as mentioned above for current profile 500, current profile 600 may illustrate a different current profile established or tested to complete a crystallization SET process on a specific PCM structure of a memory architecture or configuration. It will be understood that different memory architectures and/or different PCM structure may have established variations compared to the values illustrated, although the base idea of a combination ramp and multi-step current profile as shown in FIG. 6 for current profile 600 is expected to apply the same.

According to some examples, the combination of a ramp and multiple current steps of current profile 500 may be seen in contrast to historical SET algorithms, which either provide a pulse that melts the crystal and then quenches it to allow the crystal to grow, or that continuously ramps up the current and temperature in a single step to achieve crystallization, or that have a substantially longer nucleation stage compared to a growth stage (e.g., around 8-10 times longer). Current profile 600 may be understood as having four different stages, initialization 630, nucleation 610, growth 620, and finalization 640.

In some examples, current profile 600 starts with an initial pulse of current at A, which initially melts PCM included in a selected memory cell. As shown in FIG. 6, the current pulse at A may be limited to below 150 μA for approximately 0.1 ns, where the current may dissipate and result in the PCM cooling at B. For this example, it is anticipated that the time from the initial pulse to the start of nucleation (i.e., the time for initialization 630) will be less than 30 ns.

According to some examples, as shown in FIG. 6, nucleation 610 begins at C, which includes application of a current of approximately 20-30 μA. Application of the 20-30 μA may occur for approximately 65 ns. For these examples, the 20-30 μA may raise a temperature of PCM included in selected memory cells to a lowest temperature to facilitate generation of crystal nuclei in the PCM. Nucleation 610 then continues for a first portion of D, which includes a linear ramp to steadily sweep from 20-30 μA to around 40-50 μA in approximately 35 ns to complete nucleation 610. The linear ramp of current for the first portion of D may linearly raise the temperature of the PCM to capture remaining bits in nucleation distribution and begin to facilitate crystal growth. Growth 620 then begins at the second portion of D, which includes further ramping of current to a high current of approximately 70 μA in approximately 35 ns to cause the PCM to steadily rise to a highest temperature which continually enhances crystal growth for low growth current bits. Growth 620 then continues to E, which includes maintaining the high current of approximately 70 μA for approximately 35 ns to enable further enhanced crystal growth and to cause the PCM to be in a SET logical state.

In some examples, as shown in FIG. 6, current profile 600 at F includes a ramp down of current during finalization 640 to reach F. For these examples, the current may be ramped to and then maintained at 20-30 μA in about 30 ns or less. Finalization 640 may include a controlled ramp down or step down with a hold at a SET-back current. It may be understood that it is possible for certain areas of PCM included in a selected memory cell may become disturbed over the course of growth 620 and melt back to an amorphous state. Finalization 640 may provide a short period of lower temperature control to allow the PCM to anneal and "heal up" disturbances in the grown crystal that might occur from some overheating in portions of the crystalline structure of the PCM.

Figure 7:
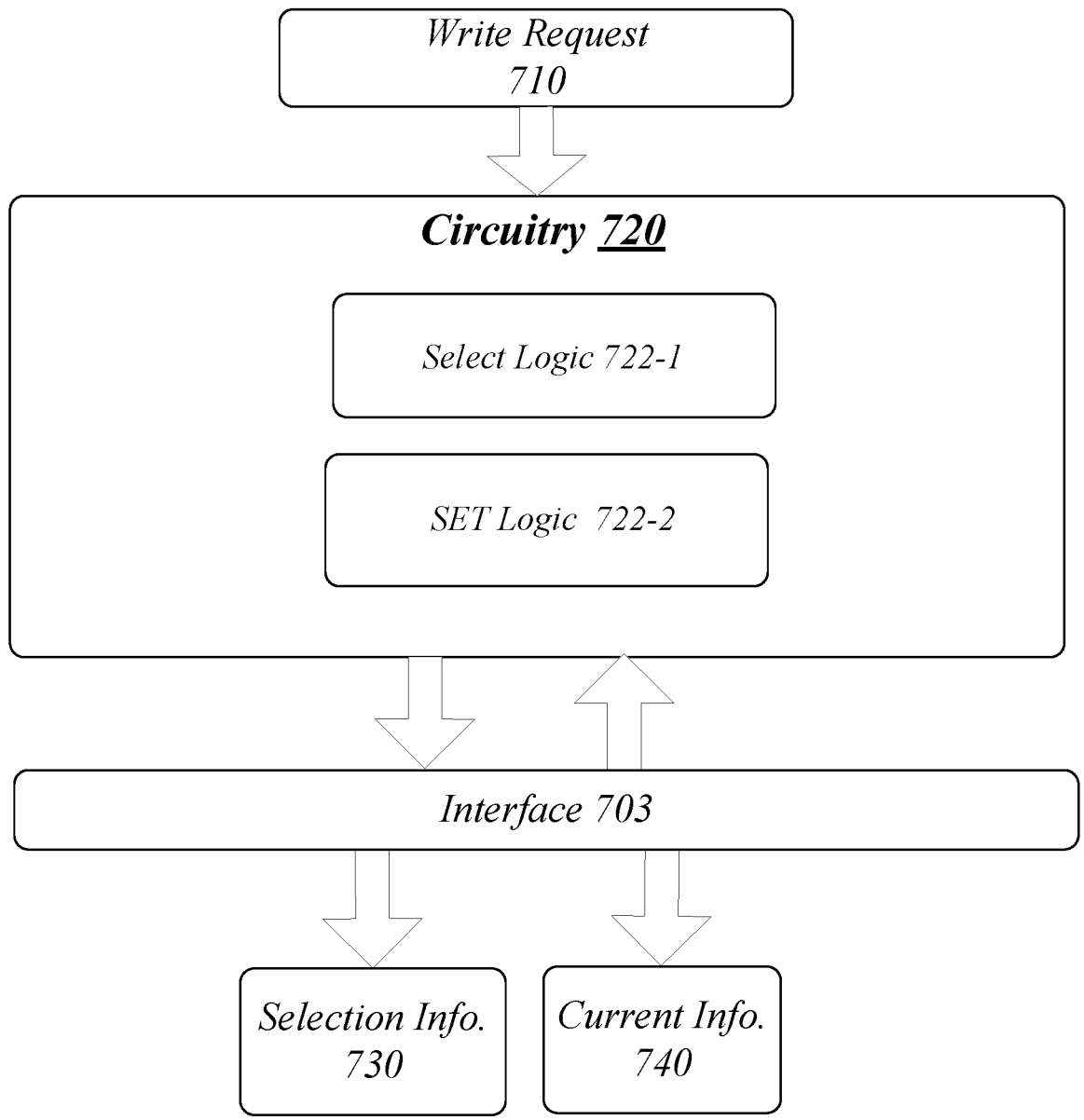
FIG. 7 illustrates an example block diagram for an apparatus.

FIG. 7 illustrates an example block diagram for an apparatus 700. Although apparatus 700 shown in FIG. 7 has a limited number of elements in a certain topology, it may be appreciated that the apparatus 700 may include more or less elements in alternate topologies as desired for a given implementation.

The apparatus 700 may be supported by circuitry 720 and apparatus 700 may be a controller maintained at a memory device or with a memory system coupled with a memory array of the memory device through an interface 703 that may also be used to access the memory cells (e.g., via read or write operations). The memory device may be coupled with or included in a host computing platform. Circuitry 720 may be arranged to execute one or more software or firmware implemented logic, components or modules 722-$a$ (e.g., implemented, at least in part, by a controller of a memory device). It is worthy to note that "a" and "b" and "c" and similar designators as used herein are intended to be variables representing any positive integer. Thus, for example, if an implementation sets a value for $a=3$, then a complete set of software or firmware for logic, components or modules 722-$a$ may include logic 722-1, 722-2 or 722-3. Also, at least a portion of "logic" may be software/firmware stored in computer-readable media, or may be implemented, at least in part in hardware and although the logic is shown in FIG. 7 as discrete boxes, this does not limit logic to storage in distinct computer-readable media components (e.g., a separate memory, etc.) or implementation by distinct hardware components (e.g., separate application-specific integrated circuits (ASICs) or field programmable gate arrays (FPGAs)).

According to some examples, circuitry 720 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples, circuitry 720 may also include one or more ASICs or FPGAs and, in some examples, at least some logic 722-$a$ may be implemented as hardware elements of these ASICs or FPGAs.

According to some examples, apparatus 700 may include a select logic 722-1. Select logic 722-1 may be a logic and/or feature executed by circuitry 720 to select a memory cell from among the memory cells of the memory array to implement a SET write operation through interface 703. For these examples, the memory cell includes a phase change material that changes resistivity based on being in a crystalline state or a non-crystalline state, the phase change material having a confined structure to become fully amorphized in all active areas in a non-crystalline state, and to lack sufficient crystal nuclei to promote crystal growth. For these examples, select logic 722-1 may select the memory cell responsive to a write request included in write request 710. Write request 710, for example, may have been sent from a host CPU or processor (e.g., processor 210 or processor 310) and may cause selection of the memory for a SET write operation. Also, selection 730 information may be routed through interface 703 and may include address information used to select the memory cell for the write operation.

In some examples, apparatus 700 may also include a SET logic 722-2. SET logic 722-2 may be a logic and/or feature executed by circuitry 720 to cause current to be applied to a terminal of the memory cell to control a change of phase change material included in the memory cell from a non-crystalline state to the crystalline state, the change from the non-crystalline state to the crystalline state to include a nucleation stage to create crystal seeds, followed by a crystal growth stage to promote crystal growth to set the crystalline state and cause the memory cell to be in a SET logical state. For these examples, the nucleation stage may include application of a first current over a first time period followed by application of at least one second current over a second time period, the crystal growth stage to include application of at least one third current and a fourth current over respective third and fourth time periods. SET logic 722-2 may route current information 740 through interface 703 to indicate respective currents and corresponding time periods to cause current to be applied to the terminal of the memory cell.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 8 illustrates an example of a logic flow 800. Logic flow 800 may be representative of some or all of the operations executed by one or more logic, features, or devices described herein, such as apparatus 700. More particularly, logic flow 800 may be implemented by one or more of select logic 722-1 or SET logic 722-2.

According to some examples, logic flow 800 at block 802 may select a memory cell included in a memory array to implement a SET write operation, the memory cell to include a phase change material that changes resistivity based on being in a crystalline state or a non-crystalline state, the phase change material having a confined structure to become fully amorphized in all active areas in a non-crystalline state, and to lack sufficient crystal nuclei to promote crystal growth. For these examples, select logic 722-1 may select the memory cell.

In some examples, logic flow 800 at block 804 may current to be applied to a terminal of the memory cell to control a change of phase change material included in the memory cell from the non-crystalline state to the crystalline state, the change from the non-crystalline state to the crystalline state to include a nucleation stage to create crystal seeds, followed by a crystal growth stage to promote crystal growth to set the crystalline state and cause the memory cell to be in a SET logical state, the nucleation stage to include application of a first current over a first time period followed by application of at least one second current over a second time period, the crystal growth stage to include application of at least one third current and a fourth current over respective third and fourth time periods. For these examples, SET logic 722-2 may cause the current to be applied to the terminal.

FIG. 9 illustrates an example of a storage medium 900. Storage medium 900 may comprise an article of manufacture. In some examples, storage medium 900 may include any non-transitory computer readable medium or machine readable medium, such as an optical, magnetic or semiconductor storage. Storage medium 900 may store various types of computer executable instructions, such as instructions to implement logic flow 800. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 10:
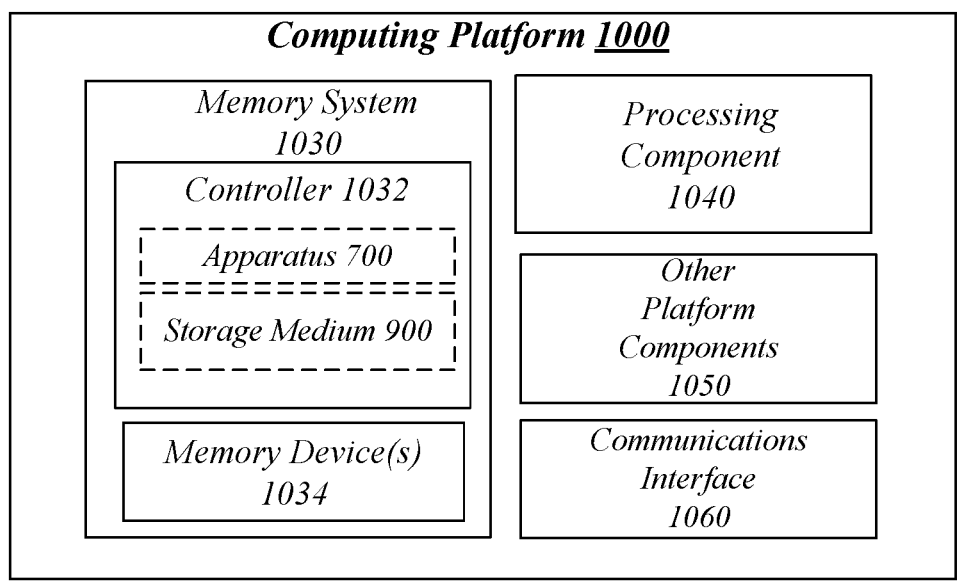
FIG. 10 illustrates an example computing platform.

FIG. 10 illustrates an example computing platform 1000. In some examples, as shown in FIG. 10, computing platform 1000 may include a memory system 1030, a processing component 1040, other platform components 1050 or a communications interface 1060. According to some examples, computing platform 1000 may be implemented in a computing device.

According to some examples, memory system 1030 may include a controller 1032 and memory devices(s) 1034. For these examples, logic and/or features resident at or located at controller 1032 may execute at least some processing operations or logic for apparatus 700 and may include storage media that includes storage medium 900. Also, memory device(s) 1034 may include similar types of non-volatile memory (not shown) that are described above for systems 100, 200 or 300 as shown in FIGS. 1-3. In some examples, controller 1032 may be part of a same die with memory device(s) 1034. In other examples, controller 1032 and memory device(s) 1034 may be located on a same die and located on a same substrate or die with a processor (e.g., included in processing component 1040). In yet other examples, controller 1032 may be in a separate die or integrated circuit coupled with memory device(s) 1034.

According to some examples, processing component 1040 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/programmable logic, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1050 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 1050 or memory system 1030 may include without limitation, various types of computer readable and machine readable storage media in the form of one or more higher speed memory units, such as read-only memory (ROM), RAM, DRAM, DDR DRAM, synchronous DRAM (SDRAM), DDR SDRAM, SRAM, programmable ROM (PROM), EPROM, EEPROM, flash memory, ferroelectric memory, SONOS memory, polymer memory such as ferroelectric polymer memory, nanowire, FeTRAM or FeRAM, ovonic memory, phase change memory, memristors, STT-MRAM, magnetic or optical cards, and any other type of storage media suitable for storing information.

In some examples, communications interface 1060 may include logic and/or features to support a communication interface. For these examples, communications interface 1060 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2018, Carrier sense Multiple access with Collision Detection (CSMA/CD) Access Method and Physical Layer Specifications, Published in August 2018 (the "IEEE 802.3-2018 specification").

Computing platform 1000 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1000 described herein, may be included or omitted in various embodiments of computing platform 1000, as suitably desired.

The components and features of computing platform 1000 may be implemented using any combination of discrete circuitry, ASICs, logic gates and/or single chip architectures. Further, the features of computing platform 1000 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

Although not depicted, any system can include and use a power supply such as but not limited to a battery, AC-DC converter at least to receive alternating current and supply direct current, renewable energy source (e.g., solar power or motion based power), or the like.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A memory cell of a memory array, the memory cell comprising:
   a phase change material to change resistivity based on whether the phase change material is in a crystalline state or a non-crystalline state, the phase change material having a confined structure to become fully amorphized in all active areas in a non-crystalline state, and to lack sufficient crystal nuclei to promote crystal growth; and
   a terminal to the memory cell to provide current to control a change of the phase change material from the non-crystalline state to the crystalline state, the change from the non-crystalline state to the crystalline state to include a nucleation stage to create crystal seeds, followed by a crystal growth stage to promote crystal growth to set the crystalline state;
   wherein the nucleation stage includes:
      application of a first current over a first time period, a first step increase from the first current to a second current, and application of the second current over a second time period; and wherein the crystal growth stage includes:

a second step increase from the second current to a third current, application of the third current over a third time period, a third step increase from the third current to a fourth current, application of the fourth current over a fourth time period, and wherein the third time period and the fourth time period have the same duration.

2. The memory cell of claim 1, comprising the terminal to provide current to control the change of the phase change material from the non-crystalline state to the crystalline state via a control of temperatures associated with the first current, the second current, the third current and the fourth current.

3. The memory cell of claim 2, comprising the first current to include a single first current, the second current to include a single second current that is higher than the single first current, the third current to include a single third current that is higher than the single second current, and the fourth current to include a single fourth current that is higher than the single third current, wherein the single second current to cause the phase change material to change to a second temperature higher than a first temperature caused by the single first current, the single third current to cause the phase change material to change to a third temperature higher than the second temperature, and the single fourth current to cause the phase change material to change to a fourth temperature higher than the third temperature.

4. The memory cell of claim 3, wherein the crystal growth stage, comprising the third current is constant during the third time period and the fourth current is constant during the fourth time period.

5. The memory cell of claim 1, comprising the change of the phase change material from the non-crystalline state to the crystalline state to further include a finalization stage to anneal the phase change material.

6. The memory cell of claim 1, comprising the first time period and the second time period, when combined, are less than 1.5 times a period of time of the third time period and the fourth time period, when combined.

7. The memory cell of claim 1, wherein: the memory array comprises a cross-point memory array.

8. An apparatus comprising:

an interface to access memory cells of a memory array; and a controller, the controller to include logic, at least a portion of which is implemented as hardware, the logic to:

select a memory cell from among the memory cells of the memory array, the memory cell to include a phase change material that changes resistivity based on being in a crystalline state or a non-crystalline state, the phase change material having a confined structure to become fully amorphized in all active areas in a non-crystalline state, and to lack sufficient crystal nuclei to promote crystal growth; and cause current to be applied to a terminal of the memory cell to control a change of phase change material included in the memory cell from a non-crystalline state to the crystalline state, the change from the non-crystalline state to the crystalline state to include a nucleation stage to create crystal seeds, followed by a crystal growth stage to promote crystal growth;

wherein the nucleation stage includes:

application of a first current over a first time period, a first step increase from the first current to a second current, and application of the second current over a second time period; and wherein the crystal growth stage includes:

a second step increase from the second current to a third current, application of the third current over a third time period, a third step increase from the third current to a fourth current, application of the fourth current over a fourth time period, and wherein the third time period and the fourth time period have the same duration.

9. The apparatus of claim 8, comprising the logic to cause current to be applied to the terminal to control the change of the phase change material from the non-crystalline state to the crystalline state via a control of temperatures associated with the first current, the second current, the third current and the fourth current.

10. The apparatus of claim 9, comprising the first current to include a single first current, the second current to include a single second current that is higher than the single first current, the third current to include a single third current that is higher than the single second current, and the fourth current to include a single fourth current that is higher than the single third current, wherein the single second current to cause the phase change material to change to a second temperature higher than a first temperature caused by the single first current, the single third current to cause the phase change material to change to a third temperature higher than the second temperature, and the single fourth current to cause the phase change material to change to a fourth temperature higher than the third temperature.

11. The apparatus of claim 8, comprising the change of the phase change material from the non-crystalline state to the crystalline state to further include the logic to cause a finalization stage to anneal the phase change material that includes the logic to cause application of a fifth current over a fifth time period.

12. The apparatus of claim 8, comprising the first time period and the second time period, when combined, are less than 1.5 times a period of time of the third time period and the fourth time period, when combined.

13. The apparatus of claim 8, wherein:

the second time period, the third time period, and the fourth time period have the same duration.

14. The apparatus of claim 8, wherein:

in the crystal growth stage, the third current is constant during the third time period and the fourth current is constant during the fourth time period.

15. The apparatus of claim 8, comprising one or more of:

one or more processors communicatively coupled to the controller;

a network interface communicatively coupled to the apparatus;

a battery coupled to the apparatus; and a display communicatively coupled to the apparatus.

16. A method comprising:

selecting a memory cell included in a memory array to implement a write operation, the memory cell to include a phase change material that changes resistivity based on being in a crystalline state or a non-crystalline state, the phase change material having a confined structure to become fully amorphized in all active areas in a non-crystalline state, and to lack sufficient crystal nuclei to promote crystal growth; and causing current to be applied to a terminal of the memory cell to control a change of phase change material included in the memory cell from the non-crystalline state to the crystalline state, the change from the non-crystalline state to the crystalline state to include a nucleation stage to create crystal seeds, followed by a crystal growth stage to promote crystal growth to set the crystalline state:

wherein the nucleation stage includes:
  applying a first current over a first time period,
  a first step increase from the first current to a second current, and
  applying the second current over a second time period; and wherein the crystal growth stage includes:
  a second step increase from the second current to a third current,
  applying the third current over a third time period,
  a third step increase from the third current to a fourth current,
  applying the fourth current over a fourth time period, and
  wherein the third time period and the fourth time period have the same duration.

17. The method of claim 16, comprising causing current to be applied to the terminal to control the change of the phase change material from the non-crystalline state to the crystalline state via a control of temperatures associated with the first current, the second current, the third current and the fourth current.

18. The method of claim 16, comprising the first current to include a single first current, the second current to include a single second current that is higher than the single first current, the third current to include a single third current that is higher than the single second current, and the fourth current to include a single fourth current that is higher than the single third current, wherein the single second current to cause the phase change material to change to a second temperature higher than a first temperature caused by the single first current, the single third current to cause the phase change material to change to a third temperature higher than the second temperature, and the single fourth current to cause the phase change material to change to a fourth temperature higher than the third temperature.

19. The method of claim 16, comprising the change of the phase change material from the non-crystalline state to the crystalline state to further include causing application of a fifth current over a fifth time period to cause a finalization stage to anneal the phase change material.

* * * * *